United States Patent
Braceras et al.

(10) Patent No.: US 6,219,288 B1
(45) Date of Patent: Apr. 17, 2001

(54) MEMORY HAVING USER PROGRAMMABLE AC TIMINGS

(75) Inventors: Geordie M. Braceras, Essex Junction; Steven H. Lamphier, St. Albans; Harold Pilo, Underhill, all of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/519,392

(22) Filed: Mar. 3, 2000

(51) Int. Cl.[7] .................................................. G11C 7/00
(52) U.S. Cl. ........................................... 365/201; 365/194
(58) Field of Search .................................... 365/201, 194

(56) References Cited

U.S. PATENT DOCUMENTS

| | | | |
|---|---|---|---|
| 5,448,525 | 9/1995 | Sturges | 365/201 |
| 5,459,737 | 10/1995 | Andrews | 371/22.5 |
| 5,491,666 | 2/1996 | Sturges | 365/201 |
| 5,596,538 | 1/1997 | Joo | 365/201 |
| 5,625,780 | * 4/1997 | Hsieh et al. | 395/311 |
| 5,650,734 | 7/1997 | Chu et al. | 326/38 |
| 5,745,419 | 4/1998 | Brauch | 365/201 |
| 5,869,980 | 2/1999 | Chu et al. | 326/38 |

OTHER PUBLICATIONS

IBM Technical Disclosure Bulletin, "Single Logic Cell Test Latch for AC Testing of Embedded Arrays", vol. 29, No. 3, Aug. 1986.

* cited by examiner

*Primary Examiner*—David Nelms
*Assistant Examiner*—M. Tran
(74) *Attorney, Agent, or Firm*—McGuireWoods, LLP; Robert A. Walsh, Esq.

(57) ABSTRACT

A SRAM module provides programmability of AC timings such that an end user can adjust or "tweak" the AC timings to maximize system performance. A variable delay circuit is placed in the path between a signal (e.g., data signal or address signal) and the SRAM set-up and hold register which allows the user to shift the setup-and-hold window by selected increments. The delay circuit can either advance or retard the AC timings. A delay program controlling the delay circuit is selected in one of two ways; either by a default AC timing program stored in a ROM device and preset by the manufacturer, or by a private JTAG instruction and AC programming data input by the user through the JTAG state machine provided on the SRAM chip. Once the optimum delay (or advance) is selected to optimize the SRAM to the cache system this user program may be permanently burned into the default ROM such that the optimum timings are used thereafter as the default.

14 Claims, 4 Drawing Sheets

| | DQSH2 | DQSH1 | DQSH0 | DELAY | A | B | C | D | E |
|---|---|---|---|---|---|---|---|---|---|
| MIDDLE DELAY SETTING (DEFAULT) | 0 | X | X | .0PS | 0 | 0 | 1 | 0 | 0 |
| FASTEST SETTING | 1 | 0 | 0 | −150PS | 1 | 0 | 0 | 0 | 0 |
| 2ND FASTEST SETTING | 1 | 0 | 1 | −75PS | 0 | 1 | 0 | 0 | 0 |
| 2ND SLOWEST SETTING | 1 | 1 | 0 | +75PS | 0 | 0 | 0 | 1 | 0 |
| SLOWEST SETTING | 1 | 1 | 1 | +150PS | 0 | 0 | 0 | 0 | 1 |

MEMORY HAVING USER PROGRAMMABLE AC TIMINGS

BACKGROUND OF THE INVENTION

1. Field of the Invention

The present invention generally relates to memory device that has user programmable alternating current (AC) timings and, more particularly, to a programmable SRAM memory which uses either default timing specifications stored in a fuse bank or allows the user to customize the timing specifications of individual pins via a JTAG instruction.

2. Description of the Related Art

Static random access memory (SRAM) is a type of high speed memory wherein each bit is represented by the state of a circuit with two stable states. Such a "bistable" circuit can be built with four transistors (for maximum density) or six (for highest speed and lowest power). SRAM retains data bits in its memory as long as power is being supplied. Unlike dynamic RAM (DRAM), which stores bits in cells made up of a capacitor and a transistor, SRAM does not have to be periodically refreshed. Static RAM provides faster access to data but is more expensive than DRAM. SRAM is commonly used for a computer's level two (L2) cache memory. The function of the L2 cache is to stand between DRAM and a computer's central processing unit (CPU), offering faster access than DRAM. Individual SRAM memory cells are typically configured in arrays and addressable subarrays that may be as large as 16 MB or more.

The timing requirements between various ports or pins accessing the various address lines and data lines is critical if the chip is to function properly. Therefore chips need to be tested to ensure their integrity. In the past chips were tested with a "bed of nails" technique wherein physical probes would come into contact with various points or test pads on the chip surface to input test signals and to measure output signals to test the inner workings of the chip. However, with the emergence of smaller and more densely integrated chips, including SRAM chips, the ability to test the chips in a non-invasive manner is desirable.

One such non-invasive testing technique that has emerged is the so-called Joint Test Action Group (JTAG) interface. JTAG is a state machine interface that is incorporated right into the design of many modern chips. This interface is a standard specified in "IEEE Standard Test Access Port and Boundary-Scan Architecture", IEEE Std 1149.1-1990 (includes IEEE Std 1149.1a-1993), published by the Institute of Electrical and Electronics Engineers, Inc. on Oct. 21, 1993. With the JTAG protocol access to all pins is achieved electronically through boundary scan principles. A JTAG interface requires the addition of several additional dedicated JTAG pins such as TMS (test mode select), TCK (test clock), TDI (test data in), and TDO (test data out).

In brief, the JTAG protocol comprises a set of standard instruction codes which when input causes test data applied to the test data in (TDI) pin to be scanned through various boundary registers by the test clock (TCK) in a programmed manner. Observing the output data at the TDO pin allows one to observe the inner workings of the circuit. The JTAG protocol further reserves a number of codes referred to a "private instructions" which may be defined by the manufacturer.

The JTAG protocol is very versatile. In addition to providing a means for performing diagnostic testing, it is also possible to use the JTAG interface to gain control of various chip functions. For example, U.S. Pat. No. 5,650,734 to Chu et al. discloses a method for using a JTAG state machine to program a programable logic device such as programmable read-only-memories (PROMs). Some types of PROMs may be erased and rewritten by using specified electrical potentials that are higher than normal operating potentials. Wu uses the dedicated JTAG ports on a PROM device to turn on and off erase and program circuitry thus eliminating the need to provide separate pins for these functions. As can be observed from above, JTAG is a versatile protocol having advantages beyond diagnostics.

As previously noted, in modern high speed memories the timings requirements between various pins on the chip is critical if the chip is to function properly. Particularly critical is the set-up and hold time requirements which refers to the time window required for the data inputs to be held stable prior to (set-up) and just after (hold) the control input changes to latch, capture or store the value indicated by the data inputs.

The integrity of data-valid windows poses a significant challenge for high-frequency input/output (I/O) interfaces. This challenge is exacerbated by the fact that the timing of the SRAM chip standing alone may be effected somewhat at the system level (i.e., once the SRAM is integrated as part of an actual cache system the timing requirements may change). Generally, the system-timing requirement for setup and hold is a total data-valid window of approximately ⅓ of the data rate. At a data rate of 200 MHz, the minimum total valid window would be 1.667 ns, or 833 ps of setup time and 833 ps of hold time. Typically, this window is guaranteed by test according to carefully controlled input swings and input slew rates. If any differences in input swings and slew rates occur in a 200 MHz cache system compared to those in the data sheets, the device is still very likely to function properly because of the relatively large setup-and-hold specifications. However, if the cache is sped up to a 1 GHz data rate, the setup-and-hold specifications become 1.67 ps each. Data rates above 1 GHz lead to even more stringent timing requirements. At these speeds, any differences in input signal characteristics between those specified in the data sheet and those in the cache system are likely cause a violation of data setup-and-hold and lead to malfunction.

FIGS. 1A and 1B illustrate how a system malfunction may occur due to setup-and-hold time violations. In FIG. 1A, Data sheet Timings for a SRAM are shown. The signals at the SRAM DQ pad are shown on the left and the corresponding clock and input signals at the DQ register are shown on the right. The shaded region illustrates the margin that the edge-triggered register requires to properly function across process and application variations. Typically, devices are designed with equal setup-and-hold margins. The cache-system timings shown in FIG. 1B illustrates the impact that changing input signal level and slew rate has on I/O circuit operation. The illustrated input characteristics are significantly different from those of the data sheet, yet are entirely possible in the physical environment of any given cache system. This specific set of inputs moves the hold margin within the critical minimum design window shown in the shaded region, causing a system failure to occur.

Hence, as is clear from the foregoing discussion, there is a need in the art to provide a way for an end user of a SRAM module to be able to program or "tweak" the timings of various data or address pins in order to optimize the SRAM module once installed in the final system.

SUMMARY OF THE INVENTION

It is therefore an object of the present invention to provide a SRAM having user programable AC timing specifications.

It is yet another object of the present invention to provide an programable SRAM wherein default program AC timings are stored in a fuse bank but can be overrode by a private JTAG instruction.

A SRAM module allows programmability of AC timings such that an end user can adjust or "tweak" the AC timings to maximize system performance. Programmability of AC timing windows at the system-level enables successful high-frequency operation. In addition, system-level programmability of AC timing windows such as input setup, input hold, and access time allows the SRAM to accommodate a wider range of I/O environments.

According to the invention, a variable delay circuit is placed in the path between a signal (e.g., data signal or address signal) and the SRAM set-up and hold register which allows the user to shift the setup-and-hold window by selected increments. The delay circuit can either advance or retard the AC timings. This enables a shifting of the setup-and-hold window which allows for differences in input characteristics between the system timing and the data sheet timing (i.e., the factory specs.). A delay program controlling the delay circuit is selected in one of two ways; either by a default AC timing program stored in a ROM device and preset by the manufacturer, or by a private JTAG instruction and AC programming data input by the user through the JTAG state machine provided on the SRAM chip. Once the optimum delay (or advance) is selected to optimize the SRAM to the cache system this user program may be permanently burned into the default ROM such that the optimum timings are used thereafter as the default.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
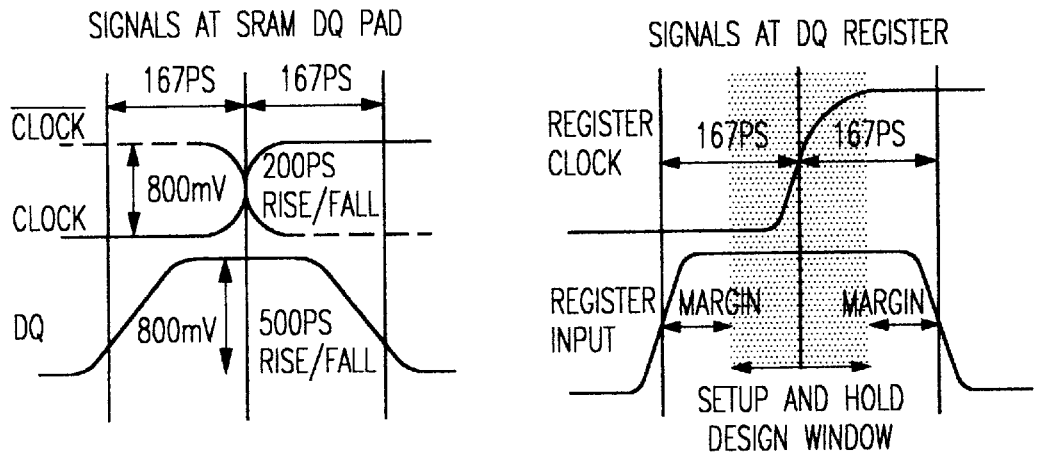
FIG. 1A is a timing diagram showing set-up and hold specifications from a SRAM data sheet.
Figure 1B:
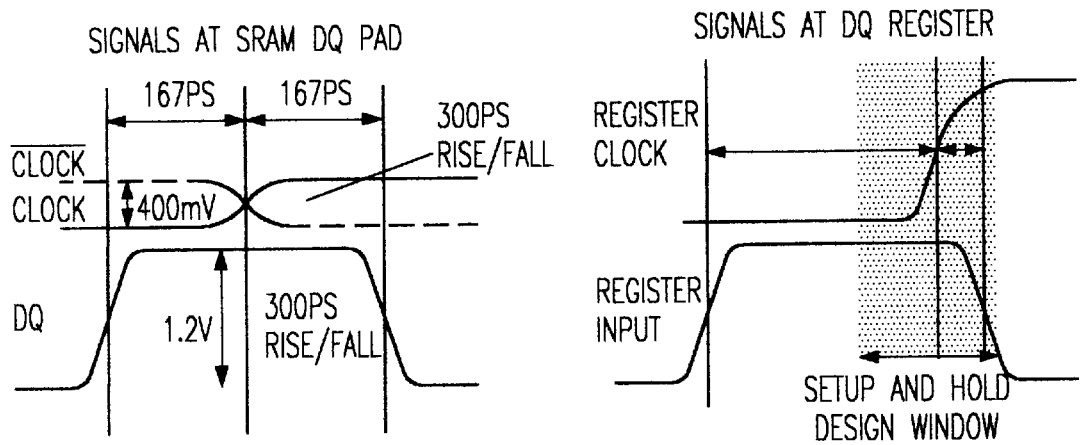
FIG. 1B is a timing diagram showing how the set-up and hold windows for a SRAM may change once integrated into a cache system and lead to malfunctions.
Figure 2:
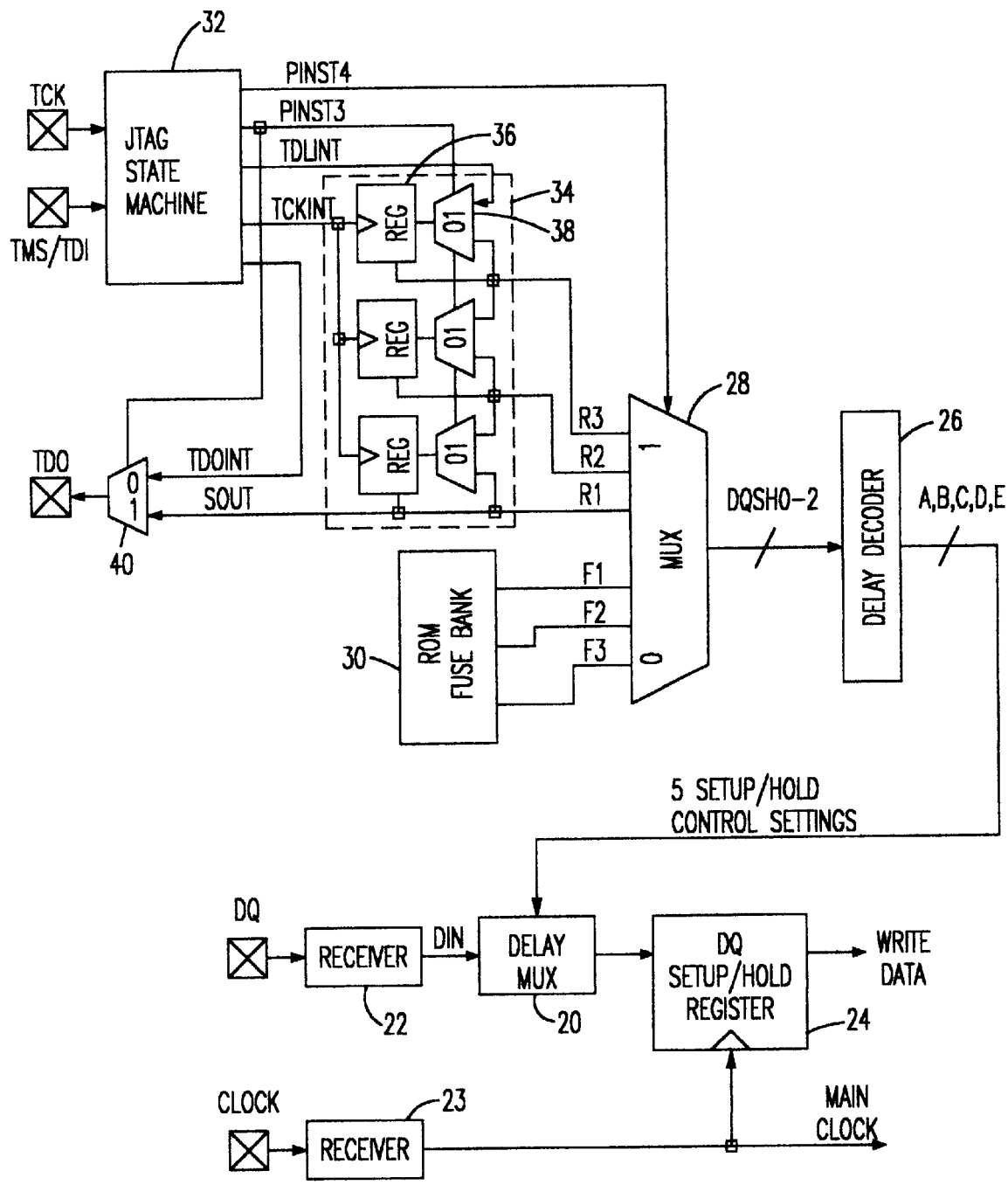
FIG. 2 circuit according to the present invention for allowing the timing specifications for a particular SRAM pin to be shifted by the user via a JTAG instruction.

Referring now to the drawings, and more particularly to FIG. 2, there is shown the relevant portions of the SRAM module according to the present invention. A delay circuit 20 is placed in a path between data input pin DQ and receiver 22 and the DQ set-up and hold register 24. The register circuit is clocked by the main system clock input through the receiver 23.

For simplicity of illustration, the delay circuit 20 is shown on the data input side (write) of the SRAM. However, it is to be understood that the teachings of the present invention are also applicable to adjusting the AC timings of either data or address pins on both the input side (write) or output side (read) of the SRAM.

A delay decoder 26 outputs one of a plurality of signals that instructs the delay circuit 20 by how much to advance or retard the AC timing of the particular DQ pin. A multiplexer (MUX) circuit 28 inputs a timing program into the delay decoder 26. This timing program originates from one of two places.

The first place that a timing program may originate is from a default timing program stored in a ROM device 30. In the preferred embodiment, this ROM device 30 is a fuse bank comprising an array of fuses which when selectively blown stores the desired timing program which is output on lines F1–F3 to the MUX 28. Initially, the default program would correspond to the timings listed on the data sheet for the SRAM (i.e, the factory specifications).

For a user programmable timing, a timing program may be input by the user via a private JTAG instruction to the JTAG state machine 32 provided on the SRAM module. The JTAG interface 32 comprises several additional dedicated JTAG pins including TMS (test mode select), TCK (test clock), TDI (test data in), and TDO (test data out) and connects to a bank of scannable latches 34. The scannable latches 34 comprise a series of registers 36 and selecting MUXes 38 which outputs a user defined timing program on lines R1–R3 to the MUX 28. Once the SRAM is integrated into a larger cache system and the end user wishes to adjust or "tweak" the AC timings of individual pins (e.g., DQ7 of DQ0–DQ35), a private JTAG instruction code is placed onto the TMS pin and thereafter the user loads the desired timing program with the TDI pin. Doing this activates lines PINST3 and PINST4. Line PINST4 causes the MUX 28 to override the default ROM 30 and instead select the user timing program from the JTAG state machine 32 to control the delay circuit 20. Line PINST3 selects the MUXes 34 in the scannable latch circuit 34 and causes data from the JTAG state machine 32 on line TDint to begin scanning through registers 36 according to the clock pulses from the TCKint signal. PINST3 may also select MUX 40 such that the output of the scannable latch 34 can be observed at the TDO pin.

Below is a table showing an example of a JTAG SRAM instruction set.

| CODE | INSTRUCTION |
| --- | --- |
| 000 | SAMPLE-Z |
| 001 | IDCODE |
| 010 | SAMPLE-Z |
| 011 | PRIVATE* |
| 100 | SAMPLE |
| 101 | PRIVATE* |
| 110 | PRIVATE* |
| 111 | BYPASS |

The JTAG protocol reserves the private instruction codes for the exclusive use of the chip manufacturer. However, the manufacturer may allow the end user to use any particular private instruction code. For example, according to the present invention, JTAG private instruction code "110" may be modified by the manufacturer to invoke a "user programmable set-up and hold" instruction. In this case, when the user loads the code "110" to the JTAG state machine 32 and then proceeds to load timing instructions into the JTAG data port (TDI) the MUX 28 will select lines R1–R3, the timing program will be scanned through the latches 34 and cause the delay circuit 20 to impose the desired time shift to the data present on the particular DQ pin.

Figures 3, 4:
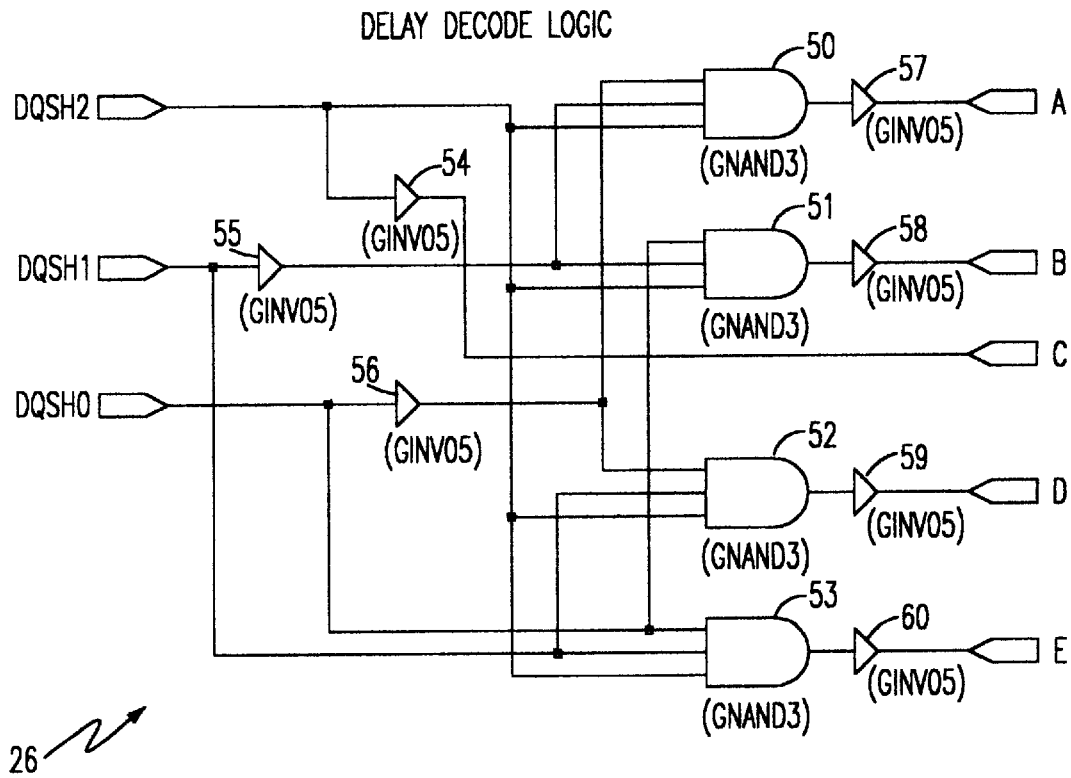
FIG. 3 is a decoder for converting JTAG state machine outputs into delay control signals.
FIG. 4 is a truth table showing the correlation between the JTAG output and the desired user programmed delay.

Referring to FIG. 3, the delay decoder 26 is shown in greater detail. The delay decoder 26 may be implemented in a number of ways. Simply stated, the delay decoder 26 decodes the user timing program information output by the JTAG state machine 32 and routed through the MUX 28 into a format recognized by the delay circuit 20. In the present example, the MUX 28 output three data signals labeled DQSH0–DQSH2 and decodes them into one of five timing shift selections. Hence, the decoder is a 3-to-5 decoder.

In the preferred embodiment, the delay decoder comprises a combinational logic circuit wherein simple three-input NAND gates 50–53 and invertors 54–60 transform three inputs DQSH0–DQSH2 into one of five output signals labeled A–E. This decoding function could also be accomplished using for example a ROM or may be bypassed altogether if the delay circuit 20 were to be designed to accept the DQSH signals directly.

FIG. 4 shows a truth table for the decoder circuit shown in FIG. 3. In the current example, there are five possible timing shift selections that may be programmed by the user for shifting the AC timing window. The AC timings of the affected pin (in this case DQ) may be advanced or retarded by 75 ps blocks and multiples thereof. Of course, 75 ps blocks is an example only and the invention is equally applicable to be designed to accommodate any amount of timing shift warranted for the particular circumstances.

Figure 5:
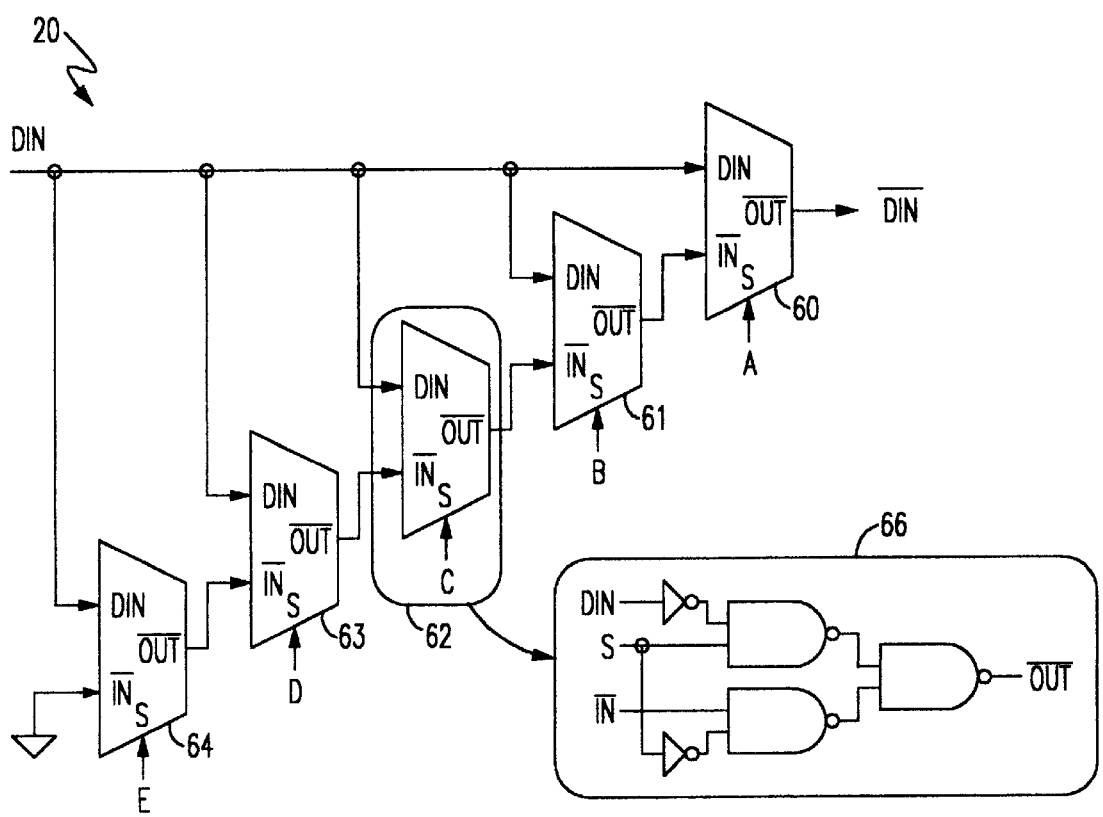
FIG. 5 is a block diagram of a user programmable delay circuit according to the present invention.

Referring to FIG. 5 there is shown a more detailed view of the delay circuit according to the present invention. A series of delay elements 60–64 are sequentially connected together. In this case, the number of delay elements (5) corresponds to the number of user programmable delays that may be imposed on data signal DQ before being written to the SRAM memory array. Each delay element comprises a combinational logic circuit 66. The DQ data signal on the Din line is received by all of the delay elements 60–64. The particular delay element which represents the user programed time shift is selected by signals A–E output by the delay decoder 26.

Referring again to the truth table shown in FIG. 4 and the delay circuit in FIG. 5, the AC timing of the DQ pin may be advanced or retarded according to the timing program imposed by the user using the JTAG state machine 32. For example, as shown delay element 62 is positioned such that selecting this element "C" will conform to no time shift. However, if the user wishes to advance the timing window by (−150 ps) then the JTAG user program will cause DQSH to be "100", thus selecting the "A" delay element 60. Since delay element 60 is after delay element 62 in the series, this has the effect of advancing the timing of the DQ signal on the Din line. Similarly, if the user wishes to retard the timing window by (+150 ps) then the JTAG user program will cause DQSH to be "111", thus selecting the "E" delay element 64. Since delay element 64 is prior to delay element 62 in the series, this has the effect of retarding the timing of the DQ signal on the Din line.

The programmability of AC specifications is not limited to setup-and hold times. SRAM access time is also programmable using the same circuit structure shown in FIG. 2. By varying access time, the user may independently change the access time of each SRAM in a cache system. This access-time programmability compensates for differences in I/O. Further, once an optimum AC timing has been found, this can be stored as the default such that in the future user programming is unnecessary.

While the invention has been described in terms of a single preferred embodiment, those skilled in the art will recognize that the invention can be practiced with modification within the spirit and scope of the appended claims.

We claim:

1. An electronic device having user programmable AC timings, comprising:
    a variable delay circuit connected to a signal line having an AC timing requirement;
    a joint test action group (JTAG) interface integral with said electronic device having a private JTAG instruction causing said JTAG interface to output a user defined AC timing program;
    a memory means for outputting a default timing program for said AC timing requirement; and
    switch means for routing an output from one of said memory means and said JTAG interface to said variable delay circuit.

2. An electronic device having user programmable AC timings as recited in claim 1, further comprising:
    a decoder for decoding a set of signals from said switch means for selecting a time shift increment for said delay circuit.

3. An electronic device having user programmable AC timings as recited in claim 1, wherein said signal line is at least one of a data line and an address line.

4. An electronic device having user programmable AC timings, comprising:
    a variable delay circuit connected to a signal line having an AC timing requirement;
    a joint test action group (JTAG) interface integral with said electronic device having a private JTAG instruction causing said JTAG interface to output a user defined AC timing program;
    a memory means for outputting a default timing program for said AC timing requirement; and
    switch means for routing an output from one of said memory means and said JTAG interface to said variable delay circuit,
    wherein said memory means comprises a fuse array.

5. An electronic device having user programmable AC timings, comprising:
    a variable delay circuit connected to a signal line having an AC timing requirement;
    a joint test action group (JTAG) interface integral with said electronic device having a private JTAG instruction causing said JTAG interface to output a user defined AC timing program;
    a memory means for outputting a default timing program for said AC timing requirement; and
    switch means for routing an output from one of said memory means and said JTAG interface to said variable delay circuit,
    wherein said switch means comprises a multiplexer.

6. An electronic device having user programmable AC timings, comprising:
    a variable delay circuit connected to a signal line having an AC timing requirement;
    a joint test action group (JTAG) interface integral with said electronic device having a private JTAG instruction causing said JTAG interface to output a user defined AC timing program;
    a memory means for outputting a default timing program for said AC timing requirement; and
    switch means for routing an output from one of said memory means and said JTAG interface to said variable delay circuit,
    wherein said AC timing requirement is a set-up and hold timing requirement.

7. An electronic device having user programmable AC timings, comprising:

a variable delay circuit connected to a signal line having an AC timing requirement;

a joint test action group (JTAG) interface integral with said electronic device having a private JTAG instruction causing said JTAG interface to output a user defined AC timing program;

a memory means for outputting a default timing program for said AC timing requirement; and switch means for routing an output from one of said memory means and said JTAG interface to said variable delay circuit, wherein said variable delay circuit comprises a series of selectable delay elements for one of advancing and retarding a signal on said signal line.

8. A memory device having user programmable AC timings, comprising:

a variable delay circuit connected to a signal line having an AC timing requirement;

a joint test action group (JTAG) interface integral with said memory device having a private JTAG instruction causing said JTAG interface to output a user defined AC timing program;

a fuse bank for storing a default timing program for said AC timing requirement; and a multiplexer for routing one of said default timing program and said user defined AC timing program to said variable delay circuit in response to said private JTAG instruction.

9. A memory device having user programmable AC timings as recited in claim 8, further comprising:

a decoder for decoding a set of signals from said multiplexer into a time shift increment select signal for said delay circuit.

10. A memory device having user programmable AC timings as recited in claim 9, wherein said variable delay circuit comprises a series of selectable delay elements for one of advancing and retarding a signal on said signal line.

11. A memory device having user programmable AC timings as recited in claim 9, wherein said signal line is one of a data line and an address line.

12. A method of adjusting signal line AC timing specifications in an electronic device equipped with a joint test action group (JTAG) interface, comprising the steps of:

connecting a variable delay circuit to a signal line;

storing a default AC timing program in a memory;

assigning a private JTAG tag instruction to execute a user defined AC timing program; and selecting one of said default AC timing program from said memory and said user defined AC timing program from said JTAG interface to control said variable delay circuit.

13. A method of adjusting signal line AC timing specifications as recited in claim 12 further comprising the step of:

advancing or retarding an AC timing of said signal line with said user defined AC timing program to find an optimum AC timing.

14. A method of adjusting signal line AC timing specifications as recited in claim 13 further comprising the step of storing said optimum AC timing as said default.

* * * * *